(12) United States Patent
Gu et al.

(10) Patent No.: US 9,121,890 B2
(45) Date of Patent: Sep. 1, 2015

(54) PLANAR METROLOGY PAD ADJACENT A SET OF FINS OF A FIN FIELD EFFECT TRANSISTOR DEVICE

(71) Applicant: GLOBALFOUNDRIES Inc., Grand Cayman (KY)

(72) Inventors: Sipeng Gu, Clifton Park, NY (US); Xiang Hu, Clifton Park, NY (US); Alok Vaid, Ballston Lake, NY (US); Lokesh Subramany, Clifton Park, NY (US); Akshey Sehgal, Malta, NY (US)

(73) Assignee: GlobalFoundries Inc., Grand Cayman (KY)

( * ) Notice: Subject to any disclaimer, the term of this patent is extended or adjusted under 35 U.S.C. 154(b) by 16 days.

(21) Appl. No.: 14/067,204

(22) Filed: Oct. 30, 2013

(65) Prior Publication Data

US 2015/0115267 A1      Apr. 30, 2015

(51) Int. Cl.
| | |
|---|---|
| *H01L 21/311* | (2006.01) |
| *H01L 21/302* | (2006.01) |
| *G01R 31/26* | (2014.01) |
| *H01L 27/088* | (2006.01) |
| *H01L 21/8234* | (2006.01) |
| *H01L 21/8238* | (2006.01) |
| *H01L 27/092* | (2006.01) |

(52) U.S. Cl.
CPC .... *G01R 31/2621* (2013.01); *H01L 21/823431* (2013.01); *H01L 21/823821* (2013.01); *H01L 27/0886* (2013.01); *H01L 27/0924* (2013.01)

(58) Field of Classification Search
CPC ......... H01L 29/66; H01L 21/33; H01L 29/78; H01L 21/30; H01L 21/31
USPC ............ 438/703, 157, 424, 443, 256; 257/48, 257/526, 618, 288, 327, E21.37–40
See application file for complete search history.

(56) References Cited

U.S. PATENT DOCUMENTS

| | | | |
|---|---|---|---|
| 2008/0296666 A1* | 12/2008 | Iijima | 257/327 |
| 2010/0015778 A1* | 1/2010 | Lin et al. | 438/443 |
| 2010/0267172 A1* | 10/2010 | Xiao et al. | 438/16 |
| 2012/0033215 A1 | 2/2012 | Kandel et al. | |
| 2012/0038021 A1* | 2/2012 | Chen et al. | 257/506 |
| 2012/0235247 A1* | 9/2012 | Cai et al. | 257/392 |
| 2013/0045580 A1* | 2/2013 | Cho | 438/296 |
| 2013/0052793 A1* | 2/2013 | Shieh et al. | 438/401 |
| 2013/0143377 A1 | 6/2013 | Siddiqui et al. | |
| 2014/0065832 A1* | 3/2014 | Hsieh et al. | 438/703 |
| 2014/0175554 A1* | 6/2014 | Loubet et al. | 257/368 |
| 2014/0256093 A1* | 9/2014 | Lin et al. | 438/157 |
| 2015/0014772 A1* | 1/2015 | Cheng et al. | 257/347 |

* cited by examiner

*Primary Examiner* — Amar Movva
*Assistant Examiner* — Sheikh Maruf
(74) *Attorney, Agent, or Firm* — Williams Morgan, P.C.

(57) ABSTRACT

Approaches for providing a substrate having a planar metrology pad adjacent a set of fins of a fin field effect transistor (FinFET) device are disclosed. Specifically, the FinFET device comprises a finned substrate, and a planar metrology pad formed on the substrate adjacent the fins in a metrology measurement area of the FinFET device. Processing steps include forming a first hardmask over the substrate, forming a photoresist over a portion of the first hardmask in the metrology measurement area of the FinFET device, removing the first hardmask in an area adjacent the metrology measurement area remaining exposed following formation of the photoresist, patterning a set of openings in the substrate to form the set of fins in the FinFET device in the area adjacent the metrology measurement area, depositing an oxide layer over the FinFET device, and planarizing the FinFET device to form the planar metrology pad in the metrology measurement area.

15 Claims, 5 Drawing Sheets

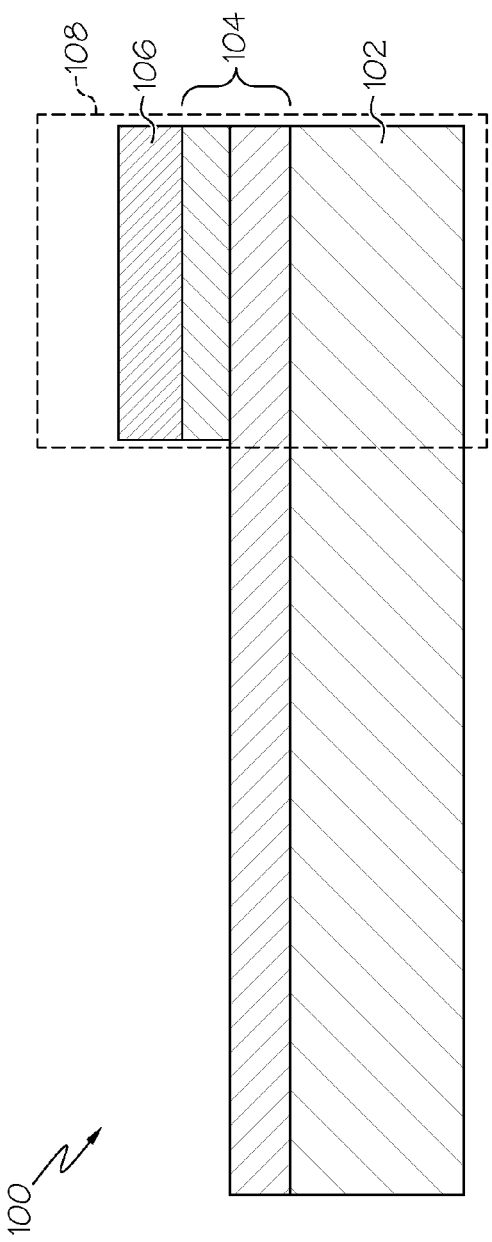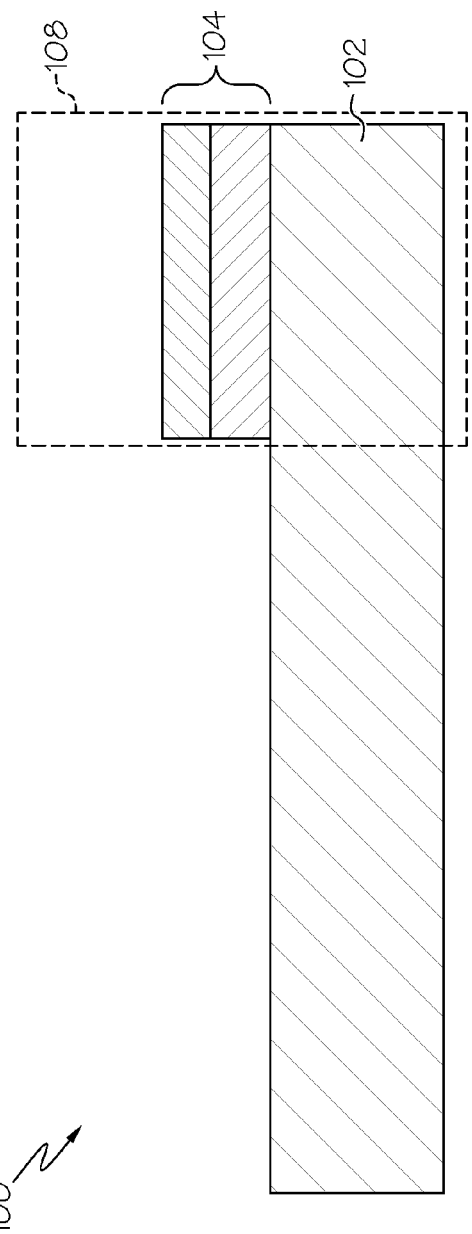

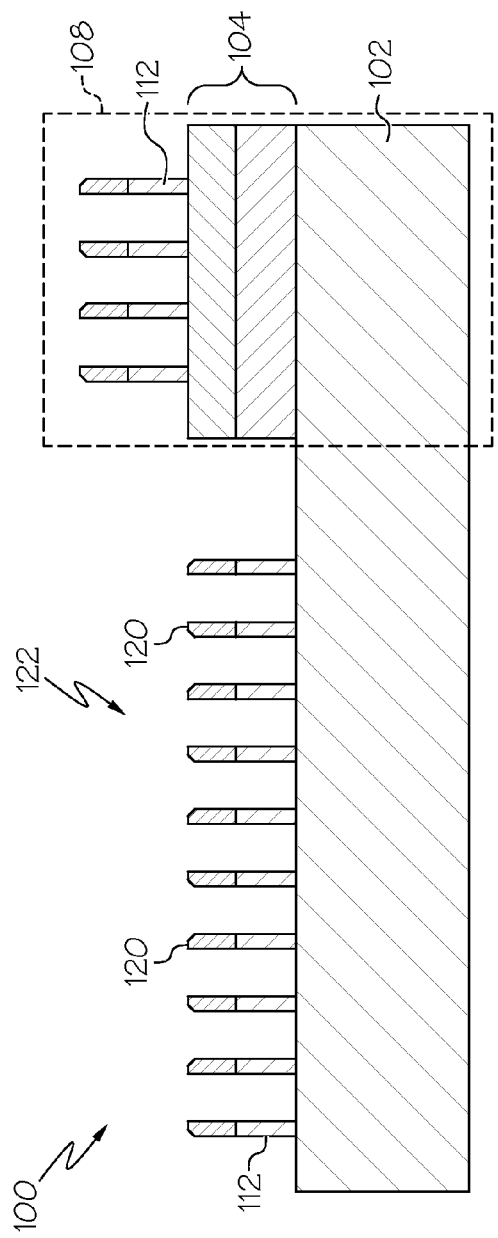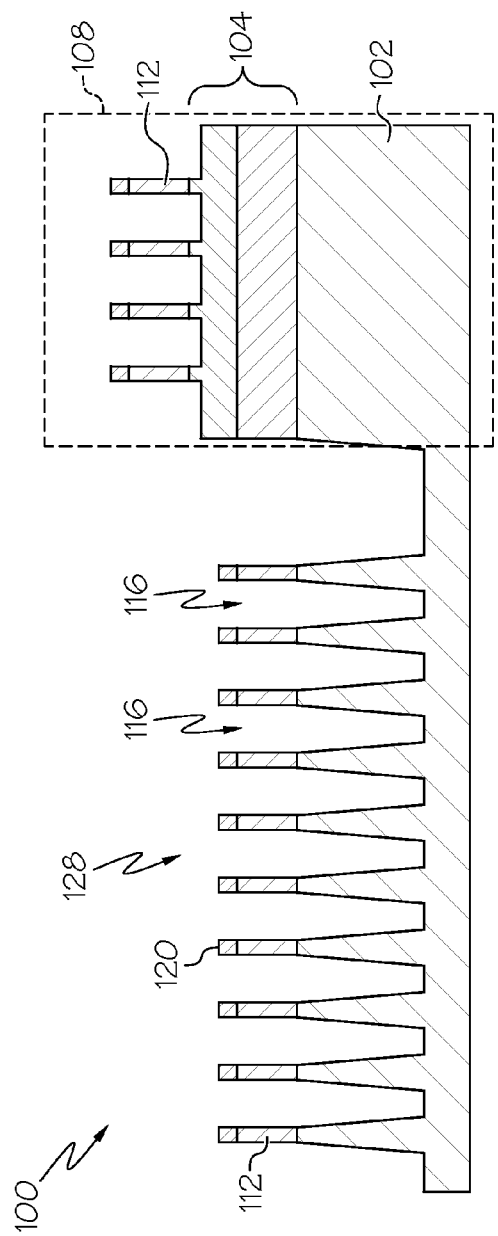

PLANAR METROLOGY PAD ADJACENT A SET OF FINS OF A FIN FIELD EFFECT TRANSISTOR DEVICE

BACKGROUND

1. Technical Field

This invention relates generally to the field of semiconductors, and more particularly, to providing a substrate having a planar metrology pad adjacent a set of fins of a fin field effect transistor (FinFET) device.

2. Related Art

A typical integrated circuit (IC) chip includes a stack of several levels or sequentially formed layers of shapes. Each layer is stacked or overlaid on a prior layer and patterned to form the shapes that define devices (e.g., fin field effect transistors (FinFETs)) and connect the devices into circuits. In a typical state of the art complementary insulated gate FinFET process, such as what is normally referred to as CMOS, layers are formed on a wafer to form the devices on a surface of the wafer. Further, the surface may be the surface of a silicon layer on a silicon on insulator (SOI) wafer. A simple FinFET includes a gate layer rectangle on a silicon island formed from the silicon surface layer. Each of these layers of shapes, also known as mask levels or layers, may be created or printed optically through well known photolithographic masking, developing and level definition, e.g., etching, implanting, deposition, etc. In some approaches, fins of the FinFET are created by a process that is similar to self-aligned double patterning. The process involves patterning of a spacer and deposition of liners on top of one or more hardmasks. The spacer is then etched away, followed by the hardmask, leaving behind fins. However, it currently is not possible to obtain a FIN-free region due to the nature of the hardmask etch process.

Optical metrology is commonly employed in process control applications in the semiconductor manufacturing industry due to optical metrology's non-contact and non-destructive nature. FinFETs raise new metrology complexities, as the entire 3D structure becomes critical for process control, including fin and gate dimensions, profiles and roughness, and metal gate undercuts. Due to the finification process of FinFET devices, metrology models must now take into account the fins underlying the planar metrology pad, which provides additional challenges, and may lead to insufficient results.

SUMMARY

In general, approaches for providing a planar metrology pad adjacent a set of fins of a fin field effect transistor (FinFET) device are disclosed. Specifically, the FinFET device comprises a set of fins patterned in a substrate of the FinFET device, and a planar metrology pad formed adjacent to the set of fins in a metrology measurement area of the FinFET device, wherein the planar metrology pad is substantially flat and oriented substantially perpendicular to the set of fins. Processing steps for the FinFET device include forming a first hardmask over a substrate, forming a photoresist over a portion of the first hardmask in the metrology measurement area of the FinFET device, removing the first hardmask in an area adjacent the metrology measurement area remaining exposed following formation of the photoresist, patterning a set of openings in the substrate to form the set of fins in the FinFET device in the area adjacent the metrology measurement area, depositing an oxide layer over the FinFET device, and planarizing the FinFET device to form the planar metrology pad in the metrology measurement area. As such, the planar metrology pad can be generated during the fin formation process, but without adding any additional mask layers.

One aspect of the present invention includes a method for forming a device, the method comprising: forming a first hardmask over a substrate; forming a photoresist over a portion of the first hardmask in a metrology measurement area of the device; removing the first hardmask in an area adjacent the metrology measurement area remaining exposed following formation of the photoresist; patterning a set of openings in the substrate to form a set of fins in the device in the area adjacent the metrology measurement area; depositing an oxide layer over the device; and planarizing the device to form a planar metrology pad in the metrology measurement area.

Another aspect of the present invention includes forming a planar metrology pad on a fin field effect transistor (FinFET) device, the method comprising forming a first hardmask over a substrate; forming a photoresist over a portion of the first hardmask in a metrology measurement area of the FinFET device; removing the first hardmask in an area adjacent the metrology measurement area remaining exposed following formation of the photoresist; patterning a set of openings in the substrate to form a set of fins in the FinFET device in the area adjacent the metrology measurement area; depositing an oxide layer over the FinFET device; and planarizing the FinFET device to form a planar metrology pad in the metrology measurement area.

Yet another aspect of the present invention includes a fin field effect transistor (FinFET) device, comprising: a set of fins patterned in a substrate of the FinFET device; and a planar metrology pad formed adjacent to the set of fins in a metrology measurement area of the FinFET device, wherein the planar metrology pad is substantially flat and oriented substantially perpendicular to the set of fins.

BRIEF DESCRIPTION OF THE DRAWINGS

These and other features of this invention will be more readily understood from the following detailed description of the various aspects of the invention taken in conjunction with the accompanying drawings in which:

FIG. 1 shows a cross-sectional view of the formation of a first hardmask and a photoresist over a substrate of a FinFET device according to illustrative embodiments;

FIG. 2 shows a cross-sectional view of the partial removal of the first mask according to illustrative embodiments;

FIG. 7 shows a cross-sectional view following an etch of the second hardmask according to illustrative embodiments;

FIG. 8 shows a cross-sectional view of a set of fins patterned in the substrate according to illustrative embodiments.

Figure 3:
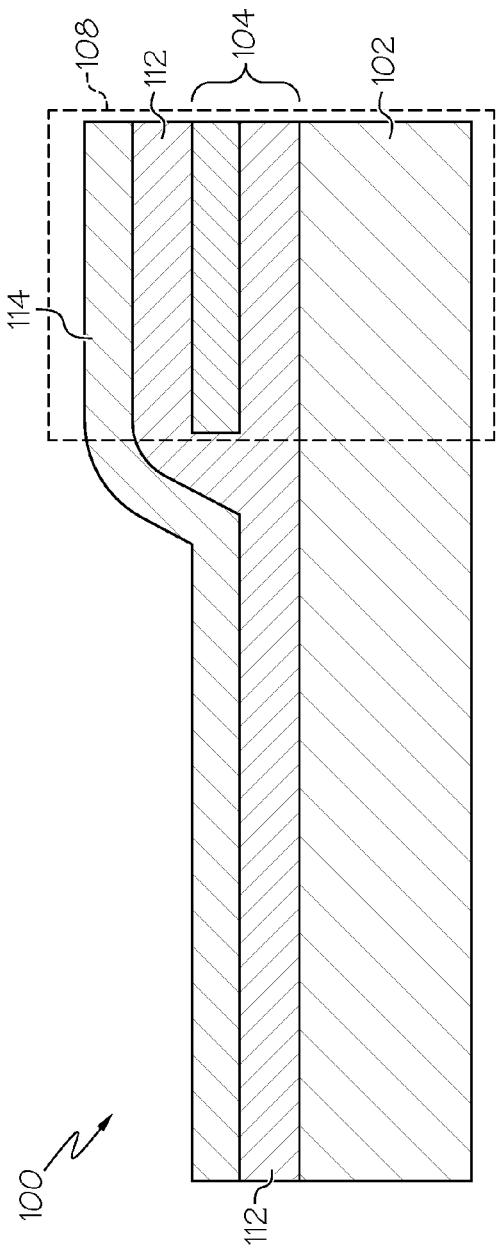
FIG. 3 shows a cross-sectional view of the formation of a second hardmask and a mandrel layer over the device according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

Described herein are approaches for providing a semiconductor substrate having a planar metrology pad adjacent a set of fins of a fin field effect transistor (FinFET) device. Specifically, the FinFET device comprises a set of fins patterned in a substrate of the FinFET device, and a planar metrology pad formed adjacent to the set of fins in a metrology measurement area of the FinFET device, wherein the planar metrology pad is substantially flat and oriented substantially perpendicular to the set of fins. Processing steps for the FinFET device include forming a first hardmask over a substrate, forming a photoresist over a portion of the first hardmask in the metrology measurement area of the FinFET device, removing the first hardmask in an area adjacent the metrology measurement area remaining exposed following formation of the photoresist, patterning a set of openings in the substrate to form the set of fins in the FinFET device in the area adjacent the metrology measurement area, depositing an oxide layer over the FinFET device, and planarizing the FinFET device to form the planar metrology pad in the metrology measurement area. As such, the planar metrology pad is generated during the fin formation process, but without adding any additional mask layers. Once formed, the planar metrology pad ensures that traditional metrology techniques (e.g., ellipsometry, X-ray diffraction, X-ray reflectance, X-ray fluorescence, etc.) can be utilized for controlling and characterizing the complex FinFET process.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-improved CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

Referring now to the figures, FIG. 1 shows a cross sectional view of a device 100 according to an embodiment of the invention. Device 100 (e.g., a FinFET device) comprises a substrate 102, and a first hardmask 104 formed over substrate 102. The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

In one embodiment, first hardmask 104 may comprise either silicon nitride (SiN) or silicon dioxide (SiO2), or any other material(s) suitable as a hardmask, including silicon oxynitride (SiON), siliocon oxycarbide (SiOC), and the like. First hardmask 104 can be prepared by PVD, CVD, spin coating, etc., depending on the material. It will be appreciated that first hardmask 104 may include an alignment mark (not shown) due to its high optical contrast (e.g., 14%-35%).

The materials of first hardmask 104 are patterned using photolithography and etch processes. More specifically, a removal pattern is produced by applying a photoresist (PR) 106 to the surface of first hardmask 104 in a metrology measurement area 108 of device 100, exposing PR 106 to a pattern of radiation, and then developing the pattern into PR 106 utilizing a resist developer. Once the patterning of PR 106 is completed, the sections covered by the photoresist are protected while the exposed regions of first hardmask 104 adjacent metrology measurement area 108 are removed using a selective etching process that removes the unprotected regions, as shown in FIG. 2. The term "selective" in reference to a material removal process denotes that the rate of material removal for a first material is greater than the rate of removal for at least another material of the structure to which the material removal process is being applied. PR 106 may be removed using an $O_2$ ash process, or it may be stripped using a wet chemical process.

Next, as shown in FIG. 3, a second hardmask 112 (e.g., SiN) is formed over device 100, followed by a mandrel layer 114. In various embodiments, mandrel layer 114 may comprise an inorganic and/or dielectric material such as amorphous silicon, polycrystalline silicon, or silicon oxide ($SiO_x$) where x is a number greater than zero, silicon nitride ($Si_3N_4$), silicon oxynitride (SiON), or the like. Second hardmask and mandrel layer 114 may be deposited using physical vapor deposition (PVD), CVD, plasma-improved chemical vapor deposition (PECVD), atmospheric pressure chemical vapor deposition (APCVD), low-pressure CVD (LPCVD), high density plasma CVD (HD CVD), atomic layer CVD (AL-CVD), and/or other suitable processes.

Figure 4:
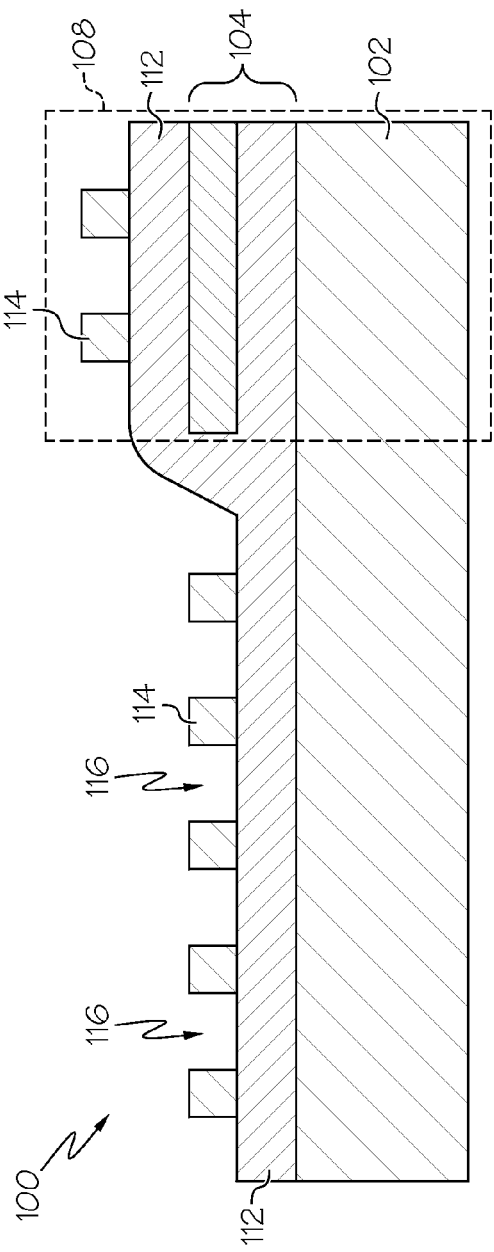
FIG. 4 shows a cross-sectional view of the patterning of a set of openings in the mandrel layer according to illustrative embodiments.

Next, as shown in FIG. 4, mandrel layer 114 is patterned to form a set of openings 116 therein, e.g., using a photo-lithography process or other lithographic process (e.g., electron beam lithography, imprint lithography, EUV lithography, etc.), and removed by a suitable etching process including a wet etch, dry etch, plasma etch, and the like.

Figure 5:
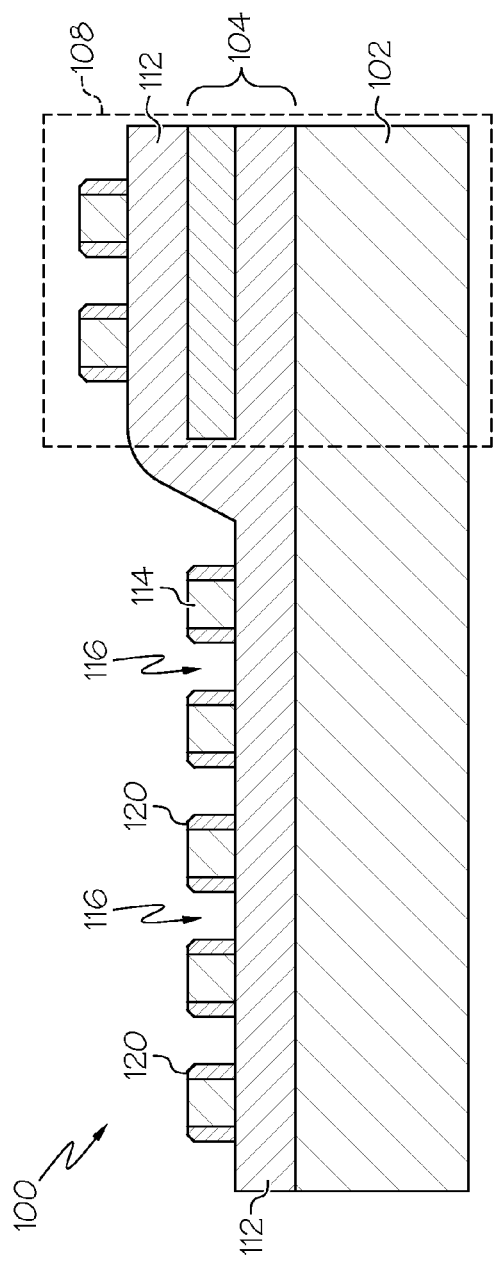
FIG. 5 shows a cross-sectional view of the formation of a set of spacers according to illustrative embodiments.

As shown in FIG. 5, a set of spacers 120 is then formed within each opening 116 along sidewalls of the patterned mandrel layer 114. As is known, spacers 120 provide a protective dielectric layer on the sidewalls of mandrel layer 114. In one embodiment, the material of each spacer 120 is selected to provide a material that will not be substantially etched by the etchant that subsequently removes mandrel layer 114. In one embodiment, set of spacers 120 comprises an oxide, and is formed using a sidewall image transfer (SIT) atomic layer deposition (ALD) and etch processes.

Figure 6:
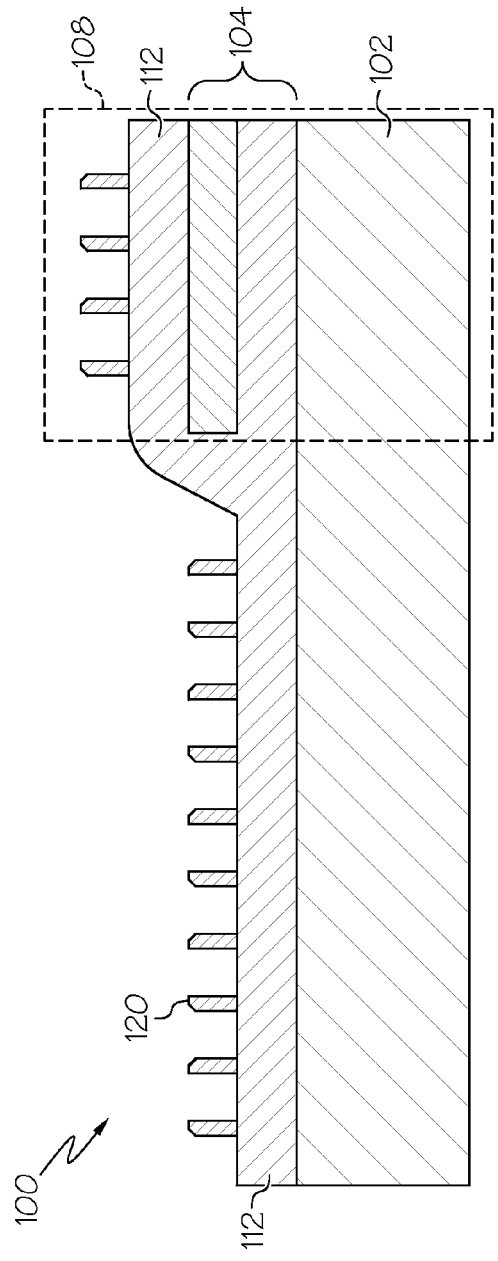
FIG. 6 shows a cross-sectional view of the device following removal of the mandrel layer from between the set of spacers according to illustrative embodiments.

Next, mandrel layer 114 is removed between each spacer 120 selective to second hardmask 112, as shown in FIG. 6, and second hardmask 112 is then etched, as shown in FIG. 7. In this embodiment, second hardmask 112 is etched selective to substrate 102 in an area 122 adjacent metrology measurement area 108 of device 100, and etched selective to first hardmask 104 in metrology measurement area 108. As shown, a portion of second hardmask 112 remains protected beneath each spacer 120.

Next, a fin etch process is formed, and openings 116 are then extended into substrate 102 to form set of fins 128, as shown in FIG. 8. Here, the fin etch process does not impact the silicon of substrate 102 in the metrology measurement area 108 due to the presence of first hardmask 104. Substrate 102 is preserved, thus allowing for the subsequent formation of a planar metrology pad 132 (FIG. 9).

Figure 9:
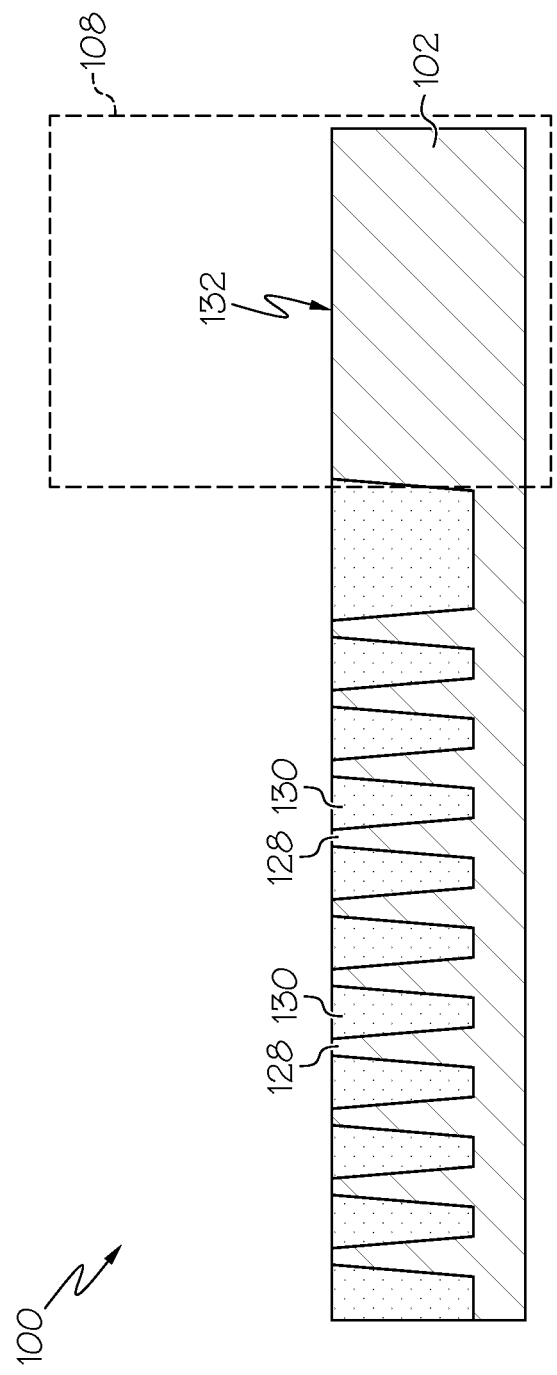
FIG. 9 shows a cross-sectional view of the device following deposition of an oxide and planarization according to illustrative embodiments.

Next, an oxide 130 is deposited over device 100, filling openings 116, as shown in FIG. 9. Oxide 130 may be formed using a high aspect ratio process such as, PVD, CVD, PECVD, APCVD, LPCVD, HD CVD, ALCVD, and/or other suitable processes. In this embodiment, oxide 130 is deposited atop all of device 100, and then removed, e.g., via chemical mechanical planarization (CMP). The planarization process also removes spacers 120, second hardmask 112, and first hardmask 104 (FIG. 8) from metrology measurement area 108 to form planar metrology pad 132, which is suitable for metrology measurements and data extraction. As shown, planar metrology pad 132 comprises a flat, horizontal surface oriented substantially perpendicular to set of fins 128. With this structure, planar metrology pad 132 provides a fin-free region to ensure that metrology techniques (e.g., ellipsometry, X-ray diffraction, X-ray reflectance, X-ray fluorescence, etc.) that rely on the existence of a uniform planar metrology pad may still be used, as the underlying fins 128 do not need to be considered.

Although not shown for the sake of brevity, it is appreciated that gate electrode and gate dielectric layers are then patterned to form gate stacks over fins 128. The fin portions not under the gate stacks are then optionally doped to form doped drain and source regions. The dopant used depends on the conductivity type of the transistor. The doped regions may be doped by ion-implanting or by plasma doping where dopants are deposited onto the fin and annealed. Source and drain regions are formed across the gate stack. Source and drain regions may be formed by ion-implanting a source/drain region or by removing a portion of the fin and epitaxially re-growing the removed portion under doping conditions to form a source/drain region.

In various embodiments, design tools can be provided and configured to create the datasets used to pattern the semiconductor layers as described herein. For example, design tools can be used for: forming a first hardmask over a substrate; forming a photoresist over a portion of the first hardmask in a metrology measurement area of the device; removing the first hardmask in an area adjacent the metrology measurement area remaining exposed following formation of the photoresist; forming a second hardmask over the device; forming a mandrel layer over the second hardmask; forming a set of openings in the mandrel layer; forming a set of spacers within the set of openings; removing the mandrel layer selective to the second hardmask; removing the second hardmask; patterning a set of openings in the substrate to form a set of fins in the device in the area adjacent the metrology measurement area; depositing an oxide over the device; and planarizing the device to form a planar metrology pad in the metrology measurement area.

To accomplish this, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that approaches have been described for providing a planar metrology pad adjacent a set of fins of a FinFET device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
    forming a first hardmask over a substrate;
    forming a photoresist over a portion of the first hardmask in a metrology measurement area of the device;
    removing the first hardmask in an area adjacent the metrology measurement area;
    patterning a set of openings in the substrate to form a set of fins in the area adjacent the metrology measurement area;
    depositing an oxide layer over the device; and
    planarizing the device to form a planar metrology pad in the metrology measurement area.

2. The method according to claim 1, further comprising:
    forming a second hardmask over the device;
    forming a mandrel layer over the second hardmask;
    forming a set of openings in the mandrel layer;
    forming a set of spacers within the set of openings in the mandrel layer;
    removing the mandrel layer selective to the second hardmask; and
    removing the second hardmask.

3. The method according to claim 2, the removing the second hardmask comprising:
    etching the second hardmask selective to the substrate in the area adjacent the metrology measurement area of the device; and
    etching the second hard mask selective to the first hardmask in the metrology measurement area of the device.

4. The method according to claim 2, the removing the mandrel layer further comprising etching the mandrel layer between each of the set of spacers.

5. The method according to claim 2, wherein the second hardmask comprises silicon nitride, and wherein the mandrel layer comprises amorphous silicon.

6. The method according to claim 1, wherein the planar metrology pad is substantially flat and oriented substantially perpendicular to the set of fins.

7. The method according to claim 1, the forming the first hardmask comprising:
    forming a silicon nitride layer over the substrate; and
    forming a silicon oxide layer over the silicon nitride.

8. The method according to claim 1, wherein the device is a fin field effect transistor device.

9. A method for forming a planar metrology pad on a substrate of a fin field effect transistor (FinFET) device, the method comprising:
    forming a first hardmask over the substrate;
    forming a photoresist over a portion of the first hardmask in a metrology measurement area of the FinFET device;
    removing the first hardmask in an area adjacent the metrology measurement area that is remaining exposed following formation of the photoresist;
    patterning a set of openings in the substrate to form a set of fins in the area adjacent the metrology measurement area;
    depositing an oxide layer over the FinFET device; and
    planarizing the FinFET device to form a planar metrology pad on the substrate in the metrology measurement area.

10. The method according to claim 9, further comprising:
    forming a second hardmask over the device;
    forming a mandrel layer over the second hardmask;
    forming a set of openings in the mandrel layer;
    forming a set of spacers within the set of openings in the mandrel layer;
    removing the mandrel layer selective to the second hardmask; and
    removing the second hardmask.

11. The method according to claim 10, the removing the second hardmask comprising:
    etching the second hardmask selective to the substrate in the area of the device adjacent the metrology measurement area; and
    etching the second hard mask selective to the first hardmask in the metrology measurement area of the device.

12. The method according to claim 10, the removing the mandrel layer further comprising etching the mandrel layer between each of the set of spacers.

13. The method according to claim 10, wherein the second hardmask comprises silicon nitride, and wherein the mandrel layer comprises amorphous silicon.

14. The method according to claim 9, wherein the planar metrology pad is substantially flat and oriented substantially perpendicular to the set of fins.

15. The method according to claim 9, the forming the first hardmask comprising:
    forming a silicon nitride layer over the substrate; and
    forming a silicon oxide layer over the silicon nitride.

* * * * *